United States Patent [19]

Tanaka et al.

[11] Patent Number: 4,725,925
[45] Date of Patent: Feb. 16, 1988

[54] CIRCUIT BOARD

[75] Inventors: Minoru Tanaka, Yokohama; Kazuo Hirota, Chigasaki; Akira Murata, Tokyo; Fumiuki Kobayashi, Sagamihara; Takaji Takenaka, Hadano, all of Japan

[73] Assignee: Hitachi, Ltd., Tokyo, Japan

[21] Appl. No.: 686,006

[22] Filed: Dec. 24, 1984

[30] Foreign Application Priority Data

Dec. 26, 1983 [JP] Japan ................... 58-243857

[51] Int. Cl.$^4$ ............................. H01H 37/36
[52] U.S. Cl. ................. 361/406; 338/307; 338/308; 338/314; 338/195; 174/68.5
[58] Field of Search ........... 361/406, 401, 402, 403, 361/409; 174/68.5; 338/307, 308, 309, 314, 195, 217

[56] References Cited

U.S. PATENT DOCUMENTS

| | | | |
|---|---|---|---|
| 2,382,024 | 8/1945 | Priessman | 338/195 |
| 2,777,039 | 1/1957 | Thias | 361/401 |
| 2,994,846 | 8/1961 | Quinn | 338/308 |
| 3,657,692 | 4/1972 | Wormser | 338/195 |
| 4,443,691 | 4/1984 | Sauer | 338/217 X |

FOREIGN PATENT DOCUMENTS 84116410 of 0000 European Pat. Off. .
1367983 9/1974 United Kingdom ........... 338/309

OTHER PUBLICATIONS

Hoffman, H. S. and Stephans, E., "Thin Film Resistor Design", IBM Tech. Discl. Bul., vol. 21, No. 6, 11/78, pp. 2279–2280.
Davis, J. H., Dobson, D. M., "Improved Thermal Characteristics of Interplane Boards", IBM Tech. Discl. Bul., vol. 18, No. 9, 2/76.
Hicks, R. E., Thin-Film Electroplated Funnel Thru-Holes on Polyimide Resin and Laminated Boards, Solid State Technology, Jul. 1973, pp. 36–40.
IBM Technical Disclosure Bulletin, vol. 23, No. 5, Oct. 1980, "MCL Top Surface Metallurgy with Cr/SiO Resistors", J. Gow III and H. S. Hoffman.

Primary Examiner—Arthur T. Grimley
Assistant Examiner—Jane K. Lau
Attorney, Agent, or Firm—Antonelli, Terry & Wands

[57] ABSTRACT

A circuit board including resistors on one surface of a board or substrate having through hole conductors arranged in a lattice like fashion. At least one electrode is formed on a surface of the resistors, at least one electrode being formed by removing a portion of a surface of the board or substrate coaxially with the through hole conductors thereby forming substantially disk-shaped resistors.

6 Claims, 9 Drawing Figures

CIRCUIT BOARD

BACKGROUND OF THE INVENTION

The present invention relates to a circuit board or substrate for installing electronic parts and, more particularly, to structures of resistors formed on the board.

In conventional circuit boards, resistors are formed on an upper surface of the board by sintering of thick film paste material or the thin film process such as evaporation depostion, sputtering, and etc.

In the arrangement of the conventional square-shaped resistors, each square-shaped resistor is formed at the position surrounded by a lattice of the four through hole conductors; however, such a conventional arrangement method has a number of drawbacks.

More particularly, in conventional arrangements, a resistor cannot be formed at an arbitrary position on the surface of the board.

It is an object of the present invention to eliminate drawbacks encountered in the prior art and to provide a circuit board in which resistors can be arranged at arbitrary positions on the board.

In accordance with the present invention, the resistors on the circuit board have circular shapes and each resistor is disk-shaped, with one electrode being arranged at the center of the resistor and the other electrode being arranged in the whole outer peripheral portion of the circle.

The present invention will be apparent from the following detailed description taken in conjunction with the accompanying drawings.

DETAILED DESCRIPTION

Figure 1:
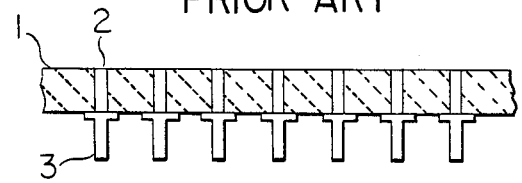
FIG. 1 is a cross sectional view of a prior art circuit board.

Referring now to the drawings wherein like reference numerals are used throughout the various views to designate like parts and, more particularly, to FIG. 1, according to this figure, a prior art circuit board or substrate includes a board 1 made of a ceramic material or the like, through hole conductors 2 extending through the board 1, and lead pins 3 electrically and mechanically connected to the through hole conductors 2 and adapted to transmit and receive signals to and from the outside of the circuit board.

Figure 2:
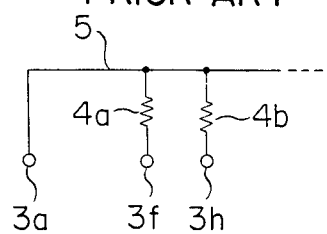
FIG. 2 is a schematic diagram showing a prior art resistor circuit.

As shown in FIG. 2, each end of the resistors $4a$, $4b$ is connected to a lead pin $3a$ through a common lead line 5, while each of the other ends of the resistors $4a$, $4b$ is connected to lead pins $3f$, $3h$.

Figure 3:
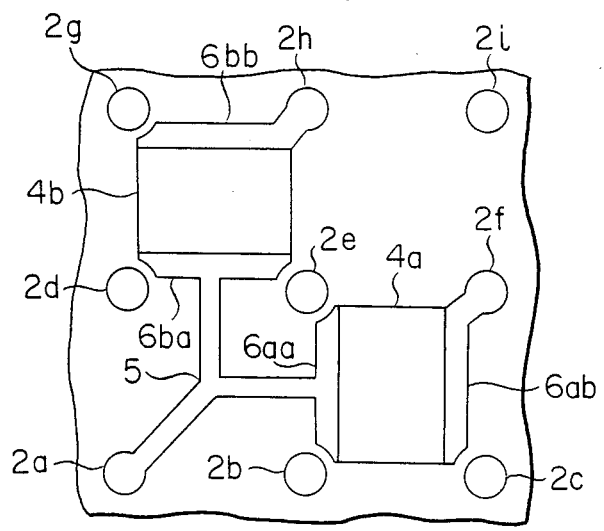
FIG. 3 is a partial plan view of the prior art circuit board of FIG. 1 on which a resistor circuit is formed with through-holes arranged in a latticed-like fashion.

As shown most clearly in FIG. 3, the resistors $4a$, $4b$ are provided with electrodes $6aa$, $6ab$, $6ba$, and $6bb$, with the electrodes $6aa$, $6ba$, on the side of each end of the resistors $4a$, $4b$ being respectively connected to a through hole conductor $2a$ through a common lead line 5, while the electrodes $6ab$, and $6bb$ on the side of the other ends are respectively connected to through hole conductors $2f$, $2h$. The through hole conductors $2a$, $2f$, $2h$ are respectively connected to the corresponding lead pins $3a$, $3f$, $3h$ shown in FIG. 2. Independent through hole conductors $2b$–$2e$, $2g$ and $2i$ are not connected to the resistor circuit pattern but are used for processing of other signals.

As shown in FIG. 3, in the case where the position of the common terminal of the resistors $4a$, $4b$ is, for example, designated as the through hole conductor $2a$, if it is desired to form the resistor 4 as well at the position surrounded by the through hole conductors $2a$, $2b$, $2d$, $2e$ and to thereby use the through hole conductor $2d$ or $2e$ as one terminal, the resistor 4 cannot be formed since the common lead line 5 exists.

Figure 4:
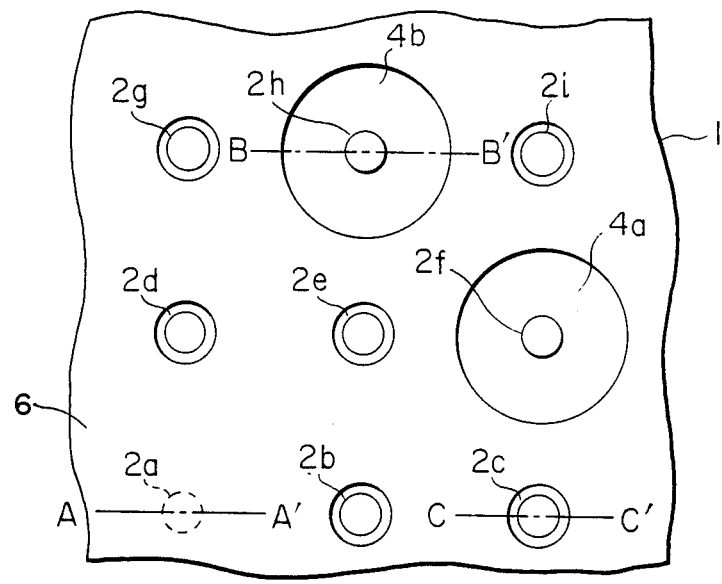
FIG. 4 is a plan view showing of one embodiment of a circuit board according to the present invention.

In accordance with the present invention, as shown in FIGS. 4 and 5 a circuit board, similar to the circuit board of FIGS. 3, 4, includes resistors $4a$ $4b$ arranged on the surface of the board or substrate 1 with the functions of the other component elements being substantially the same as those in case of FIG. 3.

A method of manufacturing a circuit board will be first described. In FIG. 5, the resistor 4 for the resistors $4a$ and $4b$ is formed as a film on the overall surface of the board 1. Then, the electrode 6 is formed as a film on the whole surface of the film resistor 4. To form the resistor $4b$ in FIG. 4, the film of the electrode 6, having a predetermined radius is removed coaxially with the through hole conductor $2h$ by, for example, an etching process or the like. Due to this, the through hole conductor $2h$ commonly serves as one electrode of the resistor $4b$, that is, the electrode $6bb$ connected to the through hole conductor $2h$ in FIG. 3. The remaining film of the electrode 6 in the outer peripheral portion of the resistor $4b$ becomes the other electrode and commonly serves as the common lead line 5 in FIG. 3.

Figures 5A, 5B, 5C:
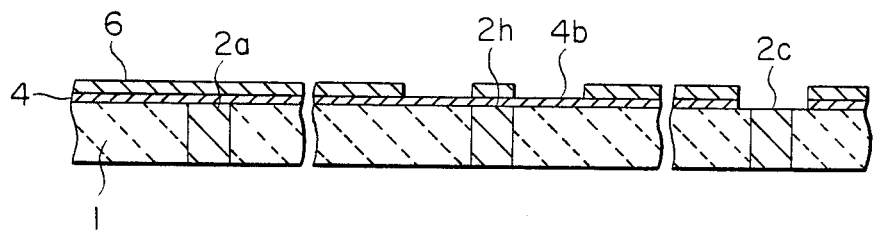
FIGS. 5A to 5C are cross sectional views taken along the lines A—A', B—B' and C—C' of FIG. 4, respectively.

The films of the resistor 4 and electrode 6 on the through hole conductor $2a$ in FIG. 5A are left as they are, thereby performing the same function as the through hole conductor $2a$ in FIG. 3.

On the other hand, by removing the films of the resistor 4 and electrode 6 in the peripheral portion on the surface of the through hole conductor $2c$ in FIG. 5C, the through hole conductor which is independent of the pattern of the resistor circuit is obtained similarly to the through hole conductor $2c$ in FIG. 3.

In addition, only the coaxial resistor in the periphery of the through hole conductor $2h$ shown in FIGS. 4 and 5B among the film-shaped resistors 4 shown in FIGS. 5A and 5B contributes substantially as the resistor $4b$. Namely, the electrical circuit across the through hole conductors $2h$ and $2a$ begins at the through hole conductor $2h$, passes through as the resistor $4b$ through the resistor 4 until the electrode 6 which is closest to the through hole conductor $2h$, and ends at the through hole conductor $2a$ shown in FIG. 5A through the electrode 6. Although the resistor 4, of a microdistance, is interposed between the electrode 6 and the through hole conductor as shown in FIG. 5A, a thickness of the resistor 4 is so thin that the resistance value of this portion can be ignored. Therefore, to make the resistance value of the resistor $4b$ variable, the radius of the resistor 4b shown in FIG. 4 and the specific resistance of the resistor 4 itself can be used as parameters.

With such an arrangement as described above, similarly to the conventional embodiment of FIG. 3, the embodiment of FIG. 4 can have substantially the same function as the resistor circuit pattern as that shown in FIG. 2.

in FIG. 4, it is also possible to form a circular resistor corresponding to the resistor 4b in the region surrounded by the through hole conductors 2a, 2b, 2d, and 2e without coming into contact with the respective through hole conductors and to put out the central electrode responsive to the through hole conductor 2h from the upper portion. Such a structure is advantageous in case of further piling other circuit layers over the resistor circuit shown in FIG. 5.

An embodiment whereby circuit layers are further piled over the resistor circuit will then be explained with reference to FIGS. 6 and 7.

Figure 6:
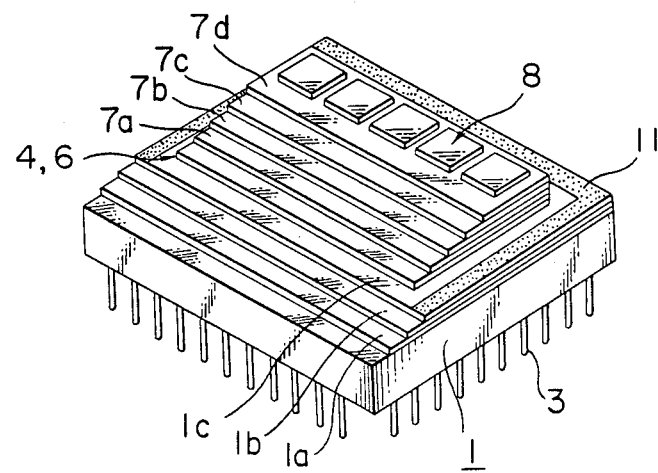
FIG. 6 is a perspective partial cut away view of the invention applied to a multilayer board.

As shown in FIG. 6, the resistor circuit layers 4 and 6 are formed over the ceramic multilayer board 1 (1a to 1c) which is formed of conductive material due to a print sintering process or the like. Further, thin film wiring layers 7 are formed on and over the layers 4 and 6 due to a so called thin film process such as, for example, the film formation by a sputtering process, pattern formation by a photo etching process, or the like.

As described above in conjunction with the cross sectional view of FIG. 5, the resistor 4 is formed as a film on the whole surface. However, in in embodiment of FIG. 7, a resistor underlayer 9 is formed under the resistor 4. The underlayer 9 is interposed in order to make the concave and convex portions of the surfaces of th board or substrate 1c flat and to prevent a diffusion of impurities from the board or substrate 1c into the resistor film 4. As the underlayer 9, it is possible to use the material which is formed by heating and curing polyimide system resin like varnish after it was coated due to a spin process or to use glass material.

Figure 7:
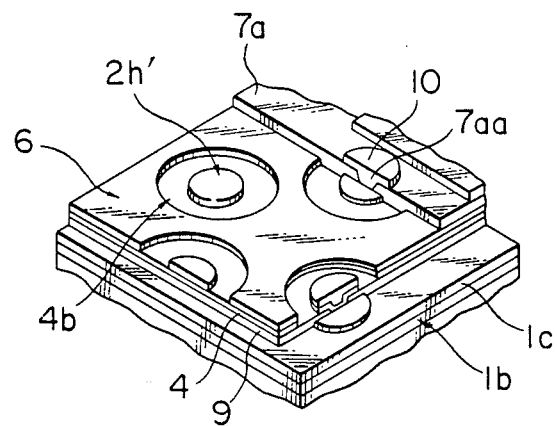
FIG. 7 is a perspective detail view, on an enlarged scale of the inner layers of FIG. 6.

As shown in FIG. 7, an individual electrode 2h' is formed by allowing the electrode 6 on the through hole conductor to remain upon etching of the film of the electrode 6. To further form the wiring layers over those resistor circuit layers, an insulation layer 7a consisting of polyimide resin or the like is first formed in a similar manner as the foregoing resistor underlayer 9; a through hole 7aa is formed in the portion corresponding to the individual electrode 2h'; and a through hole conductor 10 is further formed in this portion. The conductor 10 serves as the electrical connecting point to thin film wiring layers 7b, 7c and 7d, etc. in FIG. 6.

FIG. 6 shows a state in which electronic parts 8 such as, for example, integrated circuits, transistors or the like are installed on the top layer 7d of the thin film wiring layers. On the other hand, the resistor circuit layers 4 and 6 and thin film wiring layers 7 are constituted so as to have smaller area than the region surrounded by the frame of the board or substrate 1. The reason of this arrangement is to provide a sealing metallized layer 11 in the outer peripheral portion of the top layer 1c of the board or substrate 1. A sealing cap (not shown) is joined in accordance with this metallized layer 11.

As described above, according to the present invention, the surface of an arbitrary through hole conductor 2 on the surface of the board or substrate 1 can be used as the electrode for the resistor 4; a degree of freedom in designing of the circuit such as terminal resistors or the like and in designing of the pattern of the board can be improved; and a density of installation on the board can be remarkably improved.

On the other hand, in the foregoing embodiment, the example of the terminal resistor whereby all of the resistors 4a and 4b are connected to the electrode 6 has been explained. However, for instance, if the electrode 6 is divided into the electrodes for coupling of the individual through hole conductors, each resistor can be obviously used as the independent resistor element.

What is claimed is:

1. A circuit board arrangement comprising at least one circuit board, said circuit board comprising:
   a substrate having plurality of circular through holes therethrough,
   resistance means including a resistance layer formed on said substrate,
   first electrode means including a plurality of circular through-hole conductors respectively formed through said through-holes of said substrate, and a plurality of substantially circular electrode elements formed on said resistance layer and substantially respectively aligned with said through-hole conductors, and
   second electrode means including a continuous conductive layer formed on said resistance layer and having a plurality of circular holes respectively substantially coaxial with said through-hole conductors, each of said circular holes having a radius greater than a radius of the circular electrode elements.

2. A circuit board comprising at least:
   (a) a board having a plurality of through hole conductors;
   (b) resistors formed on one surface of said board so as to be electrically connected to said through hole conductors on said board; and
   (c) an electrode formed on the surfaces of said resistors, said electrode being removed except for portions located coaxially with said thru-hole conductors and except for a common electrode surrounding said portion so that said resistors are exposed at the removed portions of the electrodes, said portions located coaxially with said through hole constituting individual electrodes.

3. A circuit board according to claim 2, wherein individual electronic circuit elements are connected to said individual electrodes.

4. A circuit board comprising:
   a multilayer board;
   a resistance layer formed on said multilayer board;
   a plurality of substantially circular first electrode elements formed on said resistance layer;
   a second electrode element including a continuous conductor layer formed on said resistance layer, said conductor layer having a plurality of circular holes formed therein respectively coaxially with said substantially circular first electrode elements, each of said circular holes having a radius larger than a radius of said circular first electrodes; and
   a wiring layer having a plurality of through hole conductors respectively formed substantially aligned with said first electrode elements, said wiring layer being formed to cover said first and second electrode elements.

5. A circuit board according to claim 4, wherein a underlayer is formed between said multilayer board and said resistance layer.

6. A circuit board according to claim 4, wherein a radius of said first electrode elements is larger than a radius of said through hole conductors.

* * * * *